(12) United States Patent
Cater et al.

(10) Patent No.: US 10,321,590 B2
(45) Date of Patent: Jun. 11, 2019

(54) INTERLOCK FEATURES OF A PORTABLE ELECTRONIC DEVICE

(71) Applicant: Apple Inc., Cupertino, CA (US)

(72) Inventors: Tyler B. Cater, Cupertino, CA (US); Benjamin J. Pope, Mountain View, CA (US); Scott A. Myers, Saratoga, CA (US); Benjamin Shane Bustle, Cupertino, CA (US); Tseng-Mau Yang, Cupertino, CA (US); Adam J. Brinkman, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 20 days.

(21) Appl. No.: 15/454,826

(22) Filed: Mar. 9, 2017

(65) Prior Publication Data

US 2018/0070465 A1 Mar. 8, 2018

Related U.S. Application Data

(60) Provisional application No. 62/383,899, filed on Sep. 6, 2016.

(51) Int. Cl.
*H05K 5/02* (2006.01)
*H01Q 1/24* (2006.01)
(Continued)

(52) U.S. Cl.
CPC ......... *H05K 5/0208* (2013.01); *G06F 1/1626* (2013.01); *H01Q 1/24* (2013.01);
(Continued)

(58) Field of Classification Search
CPC ...... H01Q 1/24; H04B 1/3827; H05K 5/0208; H05K 5/0217
See application file for complete search history.

(56) References Cited

U.S. PATENT DOCUMENTS 6,173,898 B1 1/2001 Mande
7,958,622 B1 6/2011 Ayala et al.
(Continued)

FOREIGN PATENT DOCUMENTS

JP 5978032 B2 8/2016
KR 10-20140112326 A 9/2014
(Continued)

OTHER PUBLICATIONS

International Patent Application No. PCT/US2017/048948— International Search Report and Written Opinion dated Jan. 19, 2018.

*Primary Examiner* — James Wu
(74) *Attorney, Agent, or Firm* — Dickinson Wright RLLP (57) ABSTRACT

An electronic device having multiple housing components interlocked together by a molded material is disclosed. In order to provide interlocking surfaces for the molded material, the housing components can include various geometries designed to receive and retain the molded material such that the housing components are secured with one another. For example, a first housing part can undergo several material removal operations to form multiple ribs, each with through holes. When the molded material extends along the ribs and into the through holes, the molded material cures and interlocks with the first housing part. A second housing part can include several stepped indentions that receive the molded material. Also, a third housing part can include a dovetail indention to receive the molded material such that the first and second housing parts interlock with the third housing part. The indentions can provide retention in three dimensions to protect against decoupling.

20 Claims, 9 Drawing Sheets

(51) Int. Cl.
  *H04B 1/3827* (2015.01)
  *G06F 1/16* (2006.01)
  *H01Q 1/52* (2006.01)
  *H04M 1/02* (2006.01)

(52) U.S. Cl.
  CPC ............ *H01Q 1/243* (2013.01); *H01Q 1/521* (2013.01); *H04B 1/3827* (2013.01); *H04M 1/0202* (2013.01); *H05K 5/0217* (2013.01)

(56) References Cited

U.S. PATENT DOCUMENTS

| | | | |
|---|---|---|---|
| 8,561,831 B2 | 10/2013 | Liao | |
| 8,800,876 B2 | 8/2014 | Casden | |
| 8,844,828 B2 | 9/2014 | Speich | |
| 9,699,926 B2 | 7/2017 | Hwang et al. | |
| 2002/0133942 A1 | 9/2002 | Kenison et al. | |
| 2005/0130721 A1 | 6/2005 | Gartrell | |
| 2011/0020613 A1* | 1/2011 | Kim | B05D 5/068 |
| | | | 428/187 |
| 2011/0188178 A1* | 8/2011 | Myers | G06F 1/1626 |
| | | | 361/679.01 |
| 2012/0175165 A1* | 7/2012 | Merz | G06F 1/1656 |
| | | | 174/520 |
| 2014/0002312 A1* | 1/2014 | Konanur | H01Q 1/243 |
| | | | 343/702 |
| 2016/0072932 A1* | 3/2016 | Hill | H04M 1/0249 |
| | | | 455/575.1 |

FOREIGN PATENT DOCUMENTS

| | | |
|---|---|---|
| KR | 10-1651904 B1 | 8/2016 |
| KR | 10-20160099264 A | 8/2016 |

\* cited by examiner

INTERLOCK FEATURES OF A PORTABLE ELECTRONIC DEVICE

CROSS-REFERENCE TO RELATED APPLICATION

This application claims the benefit of priority under 35 U.S.C § 119(e) to U.S. Provisional Application No. 62/383,899, entitled "INTERLOCK FEATURES OF A PORTABLE ELECTRONIC DEVICE," filed on Sep. 6, 2016, which is incorporated by reference herein in its entirety.

FIELD

The following description relates to electronic devices. In particular, the following description relates to interlock/interconnecting two or more parts of an electronic device. The interlocking between the parts can limit or prevent decoupling the parts from one another. Also, the interlocking can provide support in multiple dimensions to offset a load or force to the electronic device in multiple dimensions.

BACKGROUND

Portable electronic devices are designed to provide various functions. For example, a portable electronic device can establish wireless communication with another electronic device. However, in some instances, the portable electronic device includes a metal housing. As generally known, metal can block or inhibit wireless transmission.

In order to overcome this, the portable electronic device can include an elongated opening (void of metal) that separates two metal housing parts. However, this configuration allows at least one of the metal housing parts to "float" relative to the other part, thereby decreasing structural stability. As a result, the portable electronic device is vulnerable to damage when a force is exerted on the device, such as when the device is dropped.

SUMMARY

In one aspect, a consumer electronic product includes a housing assembly having walls that define an internal volume, where at least one wall is a radio frequency (RF) antenna that includes a metal portion that extends a distance d into the internal volume. The metal portion has a micro-feature that is located within a region that extends from an interior surface of the wall into the internal volume to the distance d. The housing assembly also includes a non-metal portion formed of a dual state material that is capable of transitioning between a liquid state and a solid state. An interlock locks the metal portion and the non-metal portion together when an amount of the dual state material in the solid state is engaged with the micro-feature.

In another aspect, a method for making an enclosure for an electronic device, the enclosure adapted to receive a molding material. The method is carried out by cutting a channel in the enclosure to define a chassis and a housing part separate from the chassis, forming a first indention in the chassis, forming a first rib and a second rib in the housing part, the first rib and the second rib defining a second indention, and forming a through hole the first rib, the through hole opening to the second rib, wherein the first indention, the second indention, and the through hole receive the molding material to retain the housing part with the chassis.

An interlock used to join a first part formed of a metal material and a second part formed of a non-metal material that is capable of transitioning between a liquid state and a solid state includes a micro-feature formed in the first part, the micro-feature includes a first through hole having a first wall that defines a first internal cavity and characterized as having a first longitudinal axis, the first longitudinal axis being aligned with a first directional component, and a second through hole having a second wall that defines a second interior cavity and characterized as having a second longitudinal axis, the second longitudinal axis being aligned with combination of a second directional component and a third directional component. The interlock also includes an amount of the non-metal material in the solid state within the first and second cavities that locks together the first and second parts.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Those skilled in the art will appreciate and understand that, according to common practice, various features of the drawings discussed below are not necessarily drawn to scale, and that dimensions of various features and elements of the drawings can be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments can be used, and changes can be made without departing from the spirit and scope of the described embodiments.

Many modern wireless communication devices include one or more sets of wireless circuitry, which can also be referred to as radios and/or wireless subsystems herein. The multiple radios can be used by a wireless communication device to communicate independently and/or concurrently via multiple wireless communication technologies. The wireless communication technologies can use different radio frequency bands having different bandwidths and can accommodate signals at different receive signal strength levels. The wireless communication device can also include a variety of hardware circuitry to provide additional processing functions that enhance the user's experience of the wireless communication device. Modern wireless communication devices can be used for voice, video, text, data, media generation and consumption, Internet browsing, gaming, etc. In some instances, one or more different sets of hardware circuitry in the wireless communication device can generate radio frequency energy that can leak into a radio frequency band used by one or more receivers of the wireless circuitry. This energy leakage can raise the noise/interference floor and can cause a problem known as "de-sense." In many instances, de-sense can negatively impact the use of certain radio frequency bands and, in severe cases, can render certain radio frequency bands unusable. Accordingly, interference that can result in de-sense poses a problem for concurrent operation of wireless circuitry configured to receive low level radio frequency signals and hardware circuitry that generates radio frequency interference that overlaps with the receive radio frequency bands used by the wireless circuitry.

Wireless circuitry of the wireless communication device can include transmitters and receivers that provide signal processing of radio frequency wireless signals formatted according to wireless communication protocols, e.g., according to a Wi-Fi wireless communication protocol, a Bluetooth wireless communication protocol, or a cellular wireless communication protocol. In some embodiments, the wireless circuitry can include components such as: processors and/or specific-purpose digital signal processing (DSP) circuitry for implementing functionality such as, but not limited to, baseband signal processing, physical layer processing, data link layer processing, and/or other functionality; one or more digital to analog converters (DACs) for converting digital data to analog signals; one or more analog to digital converters (ADCs) for converting analog signals to digital data; radio frequency (RF) circuitry (e.g., one or more amplifiers, mixers, filters, phase lock loops (PLLs), and/or oscillators); and/or other components. The wireless circuitry can be referred to herein as a radio and can include one or more components as described hereinabove. In some embodiments, the wireless circuitry can include a processor to determine settings for and/or configure operations of the wireless circuitry. The processor of the wireless circuitry, in some embodiments, can also communicate with other processors in the wireless communication device, e.g., a control processor, a host processor, an application processor, and/or a processor in the hardware circuitry.

In accordance with various implementations, any one of these consumer electronic devices can relate to: a cellular phone or a smart phone, a tablet computer, a laptop computer, a notebook computer, a personal computer, a netbook computer, a media player device, an electronic book device, a MiFi® device, a wearable computing device, as well as any other type of electronic computing device having wireless communication capability that can include communication via one or more wireless communication protocols such as used for communication on: a wireless wide area network (WWAN), a wireless metro area network (WMAN) a wireless local area network (WLAN), a wireless personal area network (WPAN), a near field communication (NFC), a cellular wireless network, a fourth generation (4G) Long Term Evolution (LTE) network, an LTE Advanced (LTE-A) wireless network, and/or a 5G or other present or future developed advanced cellular wireless network.

As consumer electronic devices become smaller and more compact, performance of wireless circuitry can be affected. More specifically, with the advent of multi-band wireless technology (MIMO, for example), the number and placement of antennae in the consumer electronic product and the crucial to the overall wireless performance and user experience. In particular, the interaction between an RF antenna and metal incorporated within the consumer electronic product can result in parasitic capacitance that can adversely affect RF antenna performance. However, by reducing an amount of metal in order to mitigate any adverse interaction with the RF antenna, an overall structural integrity of consumer electronic product can be reduced. This is particularly true for situations where the consumer electronic product is dropped (referred to as a drop event) resulting in impact forces that cause defects in the housing of the consumer electronic product. A particularly vulnerable portion of the consumer electronic product is a corner section of the housing, also referred to as a knuckle. Due to the geometry of the knuckle, dynamic forces can be concentrated such that the housing can experience a number of impact related defects. Such defects can include separation of housing sections that can result in product failure or reduce the ability of the consumer electronic product to withstand intrusion of external media such as water, dust, etc.

Accordingly, this paper describes a number of embodiments related to structural elements and housing designs that can be used to develop more robust compact consumer electronic devices that retain good RF characteristics. The structural elements can include, for example, micro-features that are machined into chassis elements. In some embodiments, the chassis elements can be used as an RF antenna and as such can be formed of an electrically conductive material such as aluminum. For example, in order to reduce damage caused by a drop event that involves the corner portion (i.e., knuckle) of the housing as well as mitigate any detrimental affects to RF antenna performance, various interlocks can be used to lock together various elements of a housing assembly. The interlocks can, for example, lock together a metal portion of the housing assembly that can be used as an RF antenna to a plastic portion of the housing assembly (plastic or other RF transparent material is optimal for applications that utilize RF energy). In order to reliably predict any affect on the performance of the RF antenna, any metal or RF active components can be limited to a well-defined region away from active RF elements. By limiting and RF active material to a well-defined region with respect to an RF active element, any impact on RF performance can be accounted for by, for example, utilizing specific antenna designs or locations.

In one embodiment, an interlock feature can be used to lock together a metal portion with a portion formed of non-conductive material. The non-conductive material can be a dielectric such as plastic. Accordingly, the metal portion and the plastic portion can form a metal-to-plastic interface. In one embodiment, the plastic can be moldable in that the plastic can be, for example, injection molded into a suitably sized cavity having a desired shape. In one embodiment, the metal portion can include micro-features. The micro-features can be formed using various machining techniques that utilize micro-tools (such as micro T cutters) to form the micro-features at specific locations and having specific shapes. At a subsequent molding operation (such as injection molding, also referred to as a shot), plastic resin can be forced or otherwise allowed to fill, or at least substantially, fill cavities associated with the micro-features. Upon curing, the plastic molded into the cavity can essentially lock the metal portion and the plastic portion together. Moreover, by limiting the location and amount of the metal portion to a well-defined location with respect to an RF active element (such as an antenna), the overall RF performance can be maintained. It should be noted that metal-to-plastic and plastic-to-plastic interfaces could be used in the overall assembly of the housing assembly. It is advantageous, however, to maintain a minimum number of interfaces in the housing assembly as each interface represents a potential leak source, which generally is not favorable to overall lifetime or performance of the consumer electronic device.

In one embodiment, in place of large-scale interlocks (that result in a large number of interfaces, both metal-to-metal and plastic-to-plastic), small-scale interlocks can be used. The small-scale interfaces can utilize micro-feature of various sizes and shapes that can be machined at various angles with respect to a reference frame of the consumer electronic product. The use of small-scale interfaces can reduce an overall number of interfaces thereby improving the overall reliability of a housing assembly. Moreover, the small-scale nature provides the ability to place the micro-features at locations heretofore unavailable to more traditional large-scale interface. In this way, resistance of the housing assembly to external events can be substantially improved. For example, assuming that a drop event corresponds to movement of the consumer electronic product in a z direction, then a force component in the z direction can be developed upon impact. Moreover, since it is likely that any drop event will have force components in both the x,y directions, in order to reduce the likelihood of a housing impact defect, the micro-features can provide retention in the z direction, as well as x,y direction. However, in order to limit the location of the micro-features to the well-defined location and still provide good retention characteristics, the micro-features can have a x,y,z component micro-features each of which can be used in conjunction with a molding material to form an interface. In one embodiment, a first interlock feature can include a metal portion having a through-hole having an axis that that can be aligned with and generally parallel to the z direction. The through-hole can define a cavity that can accommodate a moldable material such as plastic that when cured can form a first metal-plastic interface. The first metal-plastic interface when aligned in the z direction can provide good retention in the z direction. In some cases, the through-hole can have interior walls with surface features that improve the retention of the plastic material within the cavity thereby improving the overall z retention capability. In some embodiments, the interlock can further include a second micro-feature having both y and x components. In other words, the second micro-feature can be positioned at an angle with respect to the housing assembly, the angle having components in both the x and y direction. Accordingly, the second micro-feature can include a cavity that can be used to accommodate the plastic material, giving the second interlock feature good retention properties against component forces associated with the drop event. In one embodiment, the various micro-features can be formed using machining techniques and tools such CNC utilizing micro-tool such as a micro-T cutter.

It should be noted that in some embodiments, as discussed in U.S. patent application Electronic Device Antenna With Embedded Parasitic Arm having application Ser. No. 14/829,008 that is incorporated by reference in its entirety for all purposes, the consumer electronic product can provide wireless communications in a number of frequency bands that can include, for example, low mid-band (LMB) that can extend from 1400 MHz to 1710 MHz, mid-band (MB) that can extend from about 1710 MHz to about 2170 and high-band (HB) that can extend from about 2300 MHz to about 2700 MHz. Accordingly, in order to improve RF antenna performance, a parasitic antenna resonating element can be embedded within a non-conductive medium (such as a plastic filler) in the vicinity of a main RF antenna. The parasitic antenna resonating element (or more simply, the parasitic element) can be grounded to a chassis ground (provided by, for example, metal portions of a housing assembly) and is embedded within the plastic filler. It should be noted that the purpose of the parasitic element is to modify the radiation pattern of the radio waves emitted by the RF antenna. By acting as a passive resonator (i.e., absorbing the RF energy from a nearby driven RF antenna and re-radiating the RF energy with a different phase. In this way, the RF energy from different RF antenna elements can interfere strengthening the antenna's radiation in the desired direction, and cancelling out the waves in undesired directions. For example, the passive element can be used to direct RF energy from the RF antenna in a beam in one direction thereby increasing the antenna's gain.

Therefore, it is crucial for optimal RF antenna performance that any parasitic elements be well positioned within the plastic filler and remains physically intact so as to avoid altering the resonance patterns. Accordingly, by providing a more robust interlocking mechanism, any parasitic elements can maintain their structural integrity and corresponding resonance properties These and other embodiments are discussed below with reference to FIGS. 1-11. However, those skilled in the art will readily appreciate that the detailed description given herein with respect to these Figures is for explanatory purposes only and should not be construed as limiting.

Figure 1:
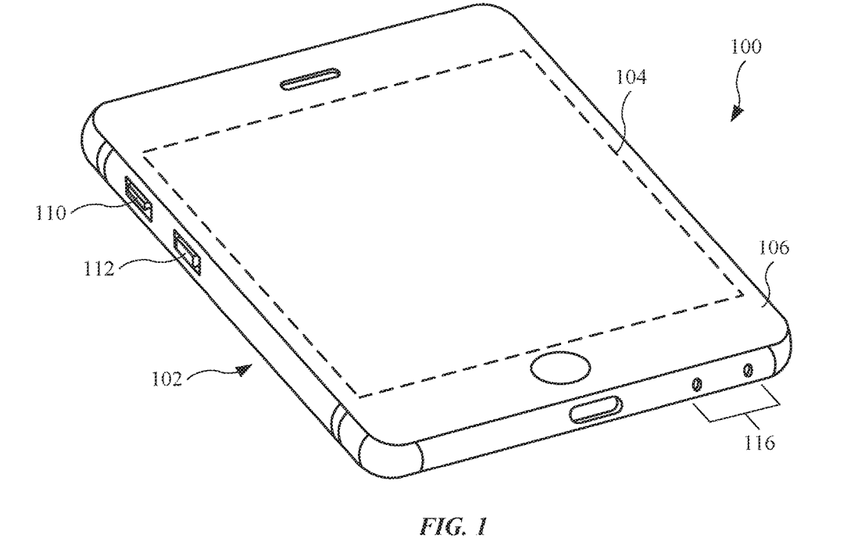
FIG. 1 illustrates a front isometric view of an embodiment of an electronic device, in accordance with some described embodiments.

FIG. 1 illustrates a front isometric view of an electronic device 100, in accordance with some described embodiments. In some embodiments, the electronic device 100 is a laptop computer device. In other embodiments, the electronic device 100 is a wearable electronic device designed to secure with an appendage of a user of the electronic device 100. In the embodiment shown in FIG. 1, the electronic device 100 is a consumer electronic device, such as a mobile wireless communication device that takes the form of, for example, a smartphone or a tablet computer device.

The electronic device 100 can include an enclosure 102 having several sidewalls and a rear wall that combine to define an internal cavity that receives several internal components (not shown), such as a processor circuit, a memory circuit, an internal power, and speaker module, as non-limiting examples. The enclosure 102 can be formed from a metal, such as aluminum or an alloy that includes aluminum. However, other materials are possible, such as a rigid plastic or ceramic. Also, when the enclosure 102 is formed from a metal, the enclosure 102 can undergo an anodization process that immersing the enclosure 102 in an anodic bath with one or more acidic compounds. The anodization process is designed to provide an aesthetic finish to the enclosure 102 as well as improve the structural rigidity.

The electronic device 100 can further include a display assembly 104 (shown as a dotted line) designed to present visual information, such as video or still images, to a user of the electronic device 100. The electronic device 100 can further include a protective layer 106 that covers the display assembly 104. The protective layer 106 can include a transparent material, such as glass or sapphire. Further, the display assembly 104 can include a touch-sensitive layer, including capacitive touch-sensitive technology, designed to respond to a touch input to the display assembly 104 (through the protective layer 106). The display assembly 104 can respond to the touch input by changing the visual information presented on the display assembly 104. Although not shown, the electronic device 100 can include a frame that carries the protective layer 106. The frame is designed to couple or mate with the enclosure 102.

The electronic device 100 can include external controls that provide an input or command to an internal component of the electronic device 100. For example, the electronic device 100 can include a switch 110 electrically coupled to a processor circuit in the electronic device 100. The switch 110 can be actuated relative to the enclosure 102 in a direction toward or away from the protective layer 106. The electronic device 100 can further include a button 112 electrically coupled to a processor circuit in the electronic device 100. The button 112 can be actuated relative to the enclosure 102 in a direction toward the enclosure 102.

The electronic device 100 can further require additional openings for associated features of the electronic device 100. For example, the electronic device 100 can include openings 116, or through holes, formed in the enclosure 102. The openings 116 can allow acoustical energy, generated by a speaker module (not shown), to exit the electronic device 100. While a discrete number of openings are shown, additional openings are possible. Moreover, some additional openings can allow airflow into and out of the electronic device 100, thereby providing an air vent for the electronic device 100.

Figure 2:
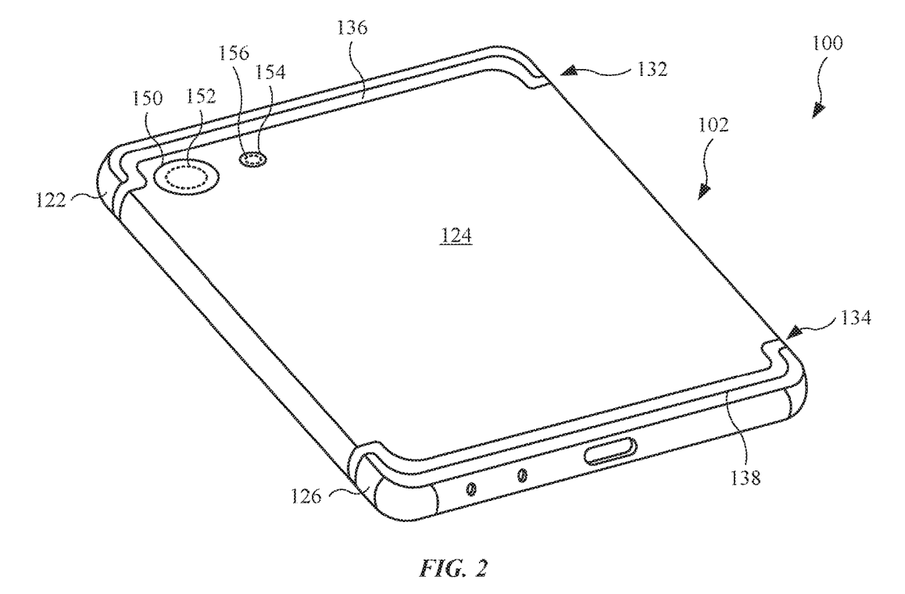
FIG. 2 illustrates a rear isometric view of the electronic device shown in FIG. 1, showing various features of the enclosure.

FIG. 2 illustrates a rear isometric view of the electronic device 100 shown in FIG. 1. As shown, the enclosure 102 can be partitioned into multiple regions. For example, the enclosure 102 can include a first housing part 122 and a second housing part 124 separated by a first channel 132. The enclosure 102 can further include a third housing part 126 separated from the second housing part 124 by a second channel 134. A cutting operation (not shown), including CNC or milling, as non-limiting examples, applied to the enclosure 102 can form the first channel 132. Accordingly, the first channel 132 and the second channel 134 define regions of the electronic device 100 void of metal. This can allow an antenna (not shown) to transmit radio frequency ("RF") communication through the first channel 132 or the second channel 134, depending upon the location of the antenna in the electronic device 100. However, the aforementioned housing parts can be interconnected or interlocked together. This will be shown and described below.

The first channel 132 and the second channel 134 can be filled a material (or materials). For example, the first channel 132 includes a material 136 designed to cover a second material (not shown) and provide an aesthetic finish to the electronic device 100. In some embodiments, the material 136 includes a polymeric material, such as plastic. The material 136 can include a moldable material applied, in liquid form, to the first channel 132 by a molding operation and then cured to solidify. Also, the material 136 can be co-planar, or approximately, co-planar with respect to the first housing part 122 and the second housing part 124. The second channel 134 can also include a material 138 that can include any feature described for the material 136 in the first channel 132.

The first housing part 122 and the third housing part 126 can provide a rigid cover to protect some components of the electronic device 100. However, in some instances, each of the first housing part 122 and the third housing part 126 can form part of an antenna used to enable wireless communication. The second housing part 124, also referred to as a chassis, can not only provide a rigid, protective cover, but also an electrical ground for internal components of the electronic device electrically coupled with the second housing part 124.

Also, the enclosure 102, and in particular, the second housing part 124, can include a first opening 150 used by a camera module 152 of the electronic device 100. Also, the second housing part 124 can include a second opening 154 used by a camera flash 156 of the electronic device 100 to enhance the image capture capabilities of the camera module 152.

Figure 3:
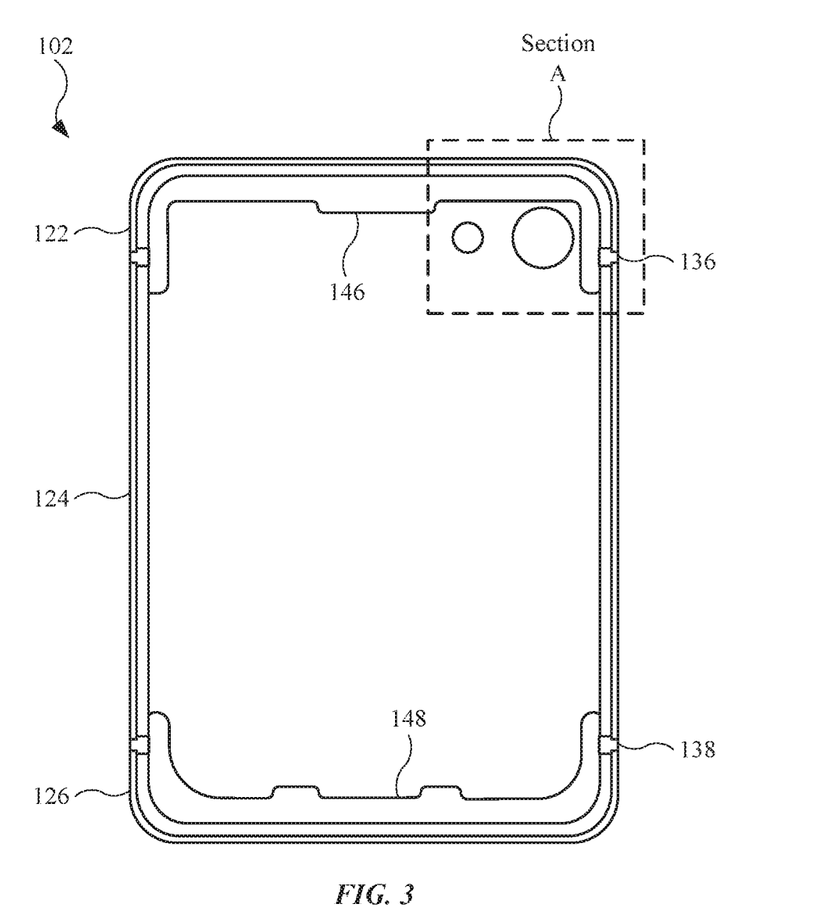
FIG. 3 illustrates a plan view of the enclosure, showing the internal cavity of the enclosure designed to receive internal components.

FIG. 3 illustrates a plan view of the enclosure 102, showing the internal cavity of the enclosure 102 designed to receive internal components. For purposes of illustration, several components are removed. As shown, a material 146 can applied to the enclosure 102. In some embodiments, the material 146 includes a resin material molded to the enclosure 102 by, for example, injection molding. The material 146, when cured, can provide structural rigidity to the enclosure 102 in locations corresponding to the first channel 132 (shown in FIG. 2). Moreover, the material 146 can be applied to the enclosure 102 in a location corresponding to the first channel 132. To further illustrate, the material 136 that fills the first channel 132 is located proximate to the material 146. Also, the material 146 can be designed and positioned to secure together the first housing part 122 with the second housing part 124. For example, the material 146 can interlock with various features of the first housing part 122 and the second housing part 124 in order to secure the first housing part 122 with the second housing part 124. This will be shown and described below. Also, the enclosure 102 can include a material 148 be applied to the enclosure 102 in a location corresponding to the second channel 134 (shown in FIG. 2), and accordingly, can be located proximate to the material 138 that fills the second channel 134. The material 148 can include any feature or features previously described for the material 146. Accordingly, the material 148 can be designed and positioned to secure together the third housing part 126 with the second housing part 124.

Figure 4:
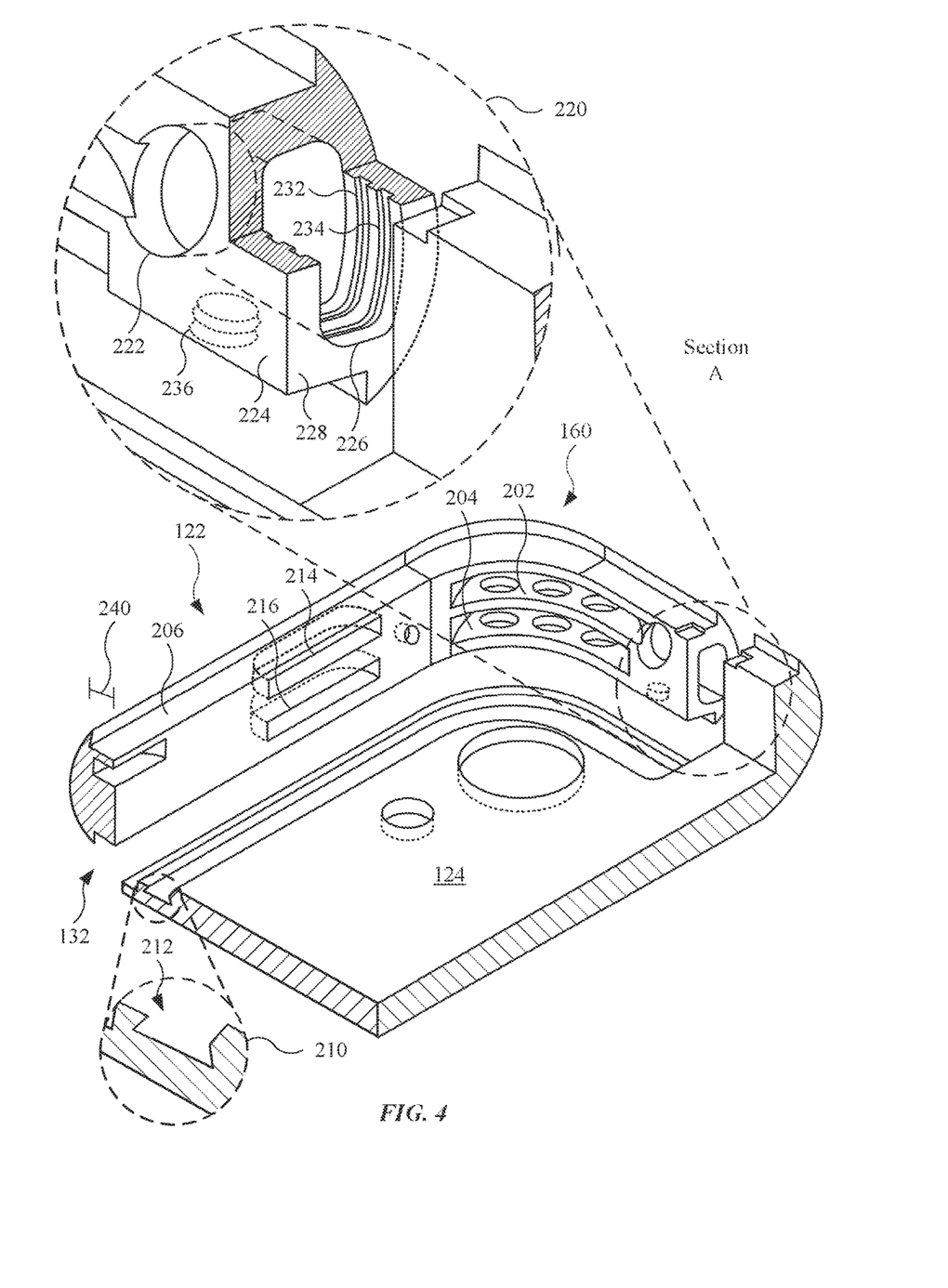
FIG. 4 illustrates an isometric view of a corner portion of the enclosure, showing various features of the enclosure that enable interlocking between the first housing part and the second housing part.

FIG. 4 illustrates an isometric view of a first corner portion 160 of the enclosure 102, showing various features of the enclosure 102 that enable interlocking between the first housing part 122 and the second housing part 124. The material 136 and the material (shown in FIG. 3) are removed to show geometric configurations of the first housing part 122 and the second housing part 124. For example, the first housing part 122 can include a first rib 202 and a second rib 204, both located approximately in the first corner portion 160. The first rib 202 and the second rib 204 can be formed by a material removal operation, including a metal cutting or machining operation. Also, as shown, the first rib 202 and the second rib 204 can include through holes (not labeled), or openings. Accordingly, each opening of the first rib 202 can be aligned with each opening of the second rib 204, and the ribs, with their associated through holes, can define a "knuckle." The through holes can be formed by a material removal operation, such as drilling, subsequent to the material removal operation used to form the first channel 132. Also, although a discrete number of openings are shown, the number of openings can vary. The material removal operation used to form the first rib 202 and the second rib 204 can define indentions. For example, a first indention (not labeled) can be formed between the first rib 202 and a platform 206. Further, a second indention (not labeled) can be formed between the first rib 202 and the second rib 204.

During a molding operation to apply the material 146 (shown in FIG. 3), the aforementioned indentions and through holes can receive the material 146. As a result, when the material 146 cures to a solid form, the material 146 becomes interlocked with the first corner portion 160 at the indentions and the through holes. Further, the first enlarged view 210 shows the second housing part 124 having a dovetail indention 212 designed to receive the material 146 during a molding operation. In this regard, the first housing part 122 can be secured with the second housing part 124 by the material 146 applied to the aforementioned indentions and through holes. This will be shown below.

The first housing part 122 can include additional indentions designed to receive a molded material. For example, the first housing part can include a third indention 214 and a fourth indention 216. The molded material is applied to the third indention 214 and the fourth indention 216, as well as to the dovetail indention 212, to provide additional securing between the first housing part 122 and the second housing part 124.

Also, as shown in the second enlarged view 220, the first housing part 122 can include a first through hole 222 located on a first surface 224, and a second through hole 226 located on a second surface 228 perpendicular, or approximately perpendicular, with respect to the first surface 224. It should be noted that first through hole 222 can be angled with respect to A partial cross section of the second through hole 226 is shown. As shown, the first through hole 222 on the first surface 224 can open to the second through hole 226 on the second surface 228. As a result, these through holes can define a compartment, and during a molding operation to mold the material 146 (shown in FIG. 3), the compartment can fill with the material 146, providing another interlock between the first housing part 122 and the material 146. This will be shown below.

Furthermore, the through holes can include additional modifications to receive additional molded material, thereby enhancing the interlocking between the molded material and the first housing part 122. For example, the second through hole 226 includes a first rib 232 and a second rib 234, both of which can be formed by an additional cutting operation. Also, the first housing part 122 can further include a blind hole 236, or bore, formed partially into the first housing part 122. The blind hole 236 can be formed by a drilling operation. Further, as shown, the blind hole 236 can include a threaded blind hole such that when the material 146 (or the material 136, shown in FIG. 2) is molded into the blind hole 236, the material 146 cures to form a threaded engagement with the first housing part 122.

Referring again to the platform 206, both the first housing part 122 and the second housing part 124 (as well as the third housing part 126, not shown) can combine to define the platform 206. The platform 206 can receive a frame (not shown) that carries the protective layer 106 (shown in FIG. 1). Further, the frame can adhesively secure with the platform 206. As shown in FIG. 4, the various geometric features discussed above are maintained below the platform 206. In other words, the platform 206 can include a dimension 240 in which the various geometric features are contained with the confines of the dimension 240. In this regard, as a result of their relatively small geometry of the features shown and described in the first housing part 122, the various ribs and through holes in the first housing part 122 can be referred to as micro-features.

Figure 5:
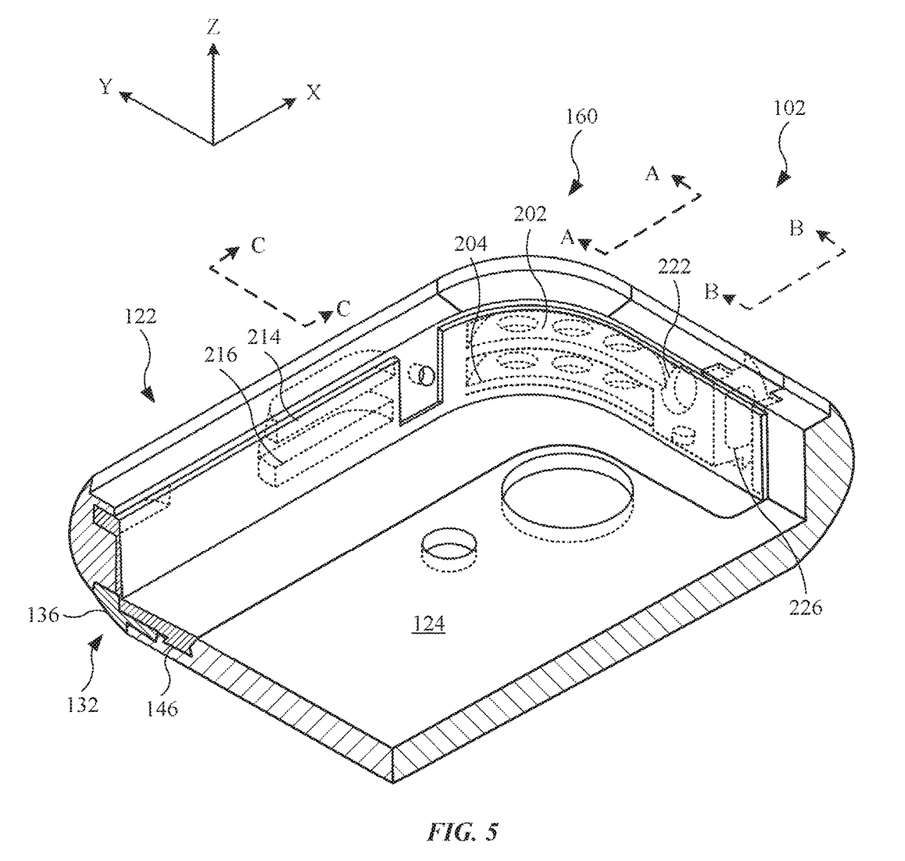
FIG. 5 illustrates an isometric view of the corner portion of the enclosure shown in FIG. 4, further showing the enclosure filled with the internal and external materials.

FIG. 5 illustrates an isometric view of the first corner portion 160 of the enclosure 102 shown in FIG. 4, further showing the enclosure 102, and in particular the first channel 132, filled with the internal and external materials. Based on their relative positions, the material 136 can be referred to as the "external material" and the material 146 can be referred to as the "internal material." Also, when the electronic device 100 (shown in FIG. 1) is assembled, the material 136 can cover, or hide, the material 146.

As shown in FIG. 5, the material 146 is molded to both the first housing part 122 and the second housing part 124. As a result, several features of the first housing part include the material 146. For example, the first rib 202 and the second rib 204, and their associated through holes, are covered by the material 146. It should be understood that the holes defined in part by the first rib 202 and the second rib 204 are filled with the material 146. By filling the "knuckle" region with the material 146, in a manner described, the material 146 interlocks with the first corner portion 160 of the first housing part 122 such that the first corner portion 160 is well-secured with the second housing part 124, when the material 146 also extends into one or more holes of the second housing part 124. This offset or counter a force exerted on the enclosure 102 that would otherwise cause the first corner portion 160 to extend away from the second housing part 124 in the x-dimension and in the y-dimension. Moreover, the resultant molding of the material 146 in the first corner portion 160 can offset or counter a force that would otherwise cause the first corner portion 160 to extend away vertically from the second housing part 124 in the y-dimension.

Also, as shown, the material 146 can fill the third indention 214 and the fourth indention 216. As a result, the material 146 in the third indention 214 and the fourth indention 216 can offset or counter a force that would otherwise cause the first corner portion 160 to extend away from the second housing part 124 in the x-dimension. Also, the material 146 can fill the first through hole 222 and the second through hole 226, and accordingly, the compartment defined by the aforementioned through holes. It should be noted that the material 146 extending into the first through hole 222 and the second through hole 226 can come into contact, and formed an interlock. As a result, the material 146 in the first through hole 222 and the second through hole 226 can offset or counter a force that would otherwise cause the first corner portion 160 to extend away from the second housing part 124 in the x-, y- or z-dimensions.

Figure 6A:
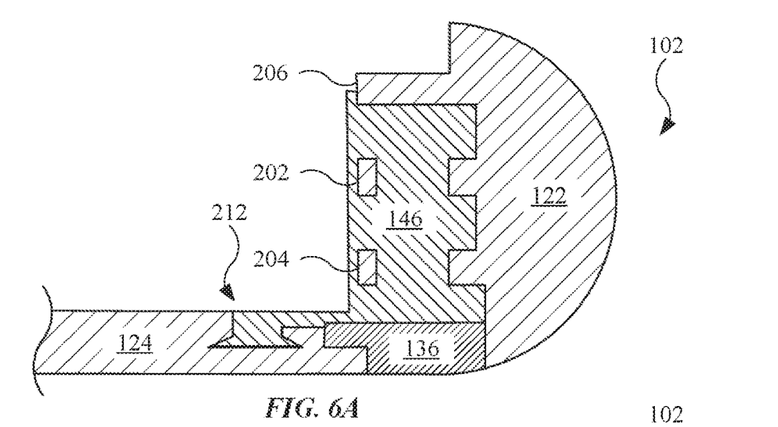
FIG. 6A illustrates a cross sectional view of the enclosure shown in FIG. 5, taken along the A-A line in FIG. 5.

FIG. 6A illustrates a cross sectional view of the enclosure 102 shown in FIG. 5, taken along the A-A line in FIG. 5. As shown, the material 146 extends through the indentions defined by the first rib 202, the second rib 204, and the platform 206. Furthermore, the material 146 can pass through the through holes in the first rib 202 and the second rib 204, thereby interlocking the material 146 with the first housing part 122. In addition, the material 146 can extend into the dovetail indention 212 of the second housing part 124, and the second housing part 124 is interlocked with the material 146. Accordingly, the material 146 can interlock with first housing part 122 with the second housing part 124.

Figure 6B:
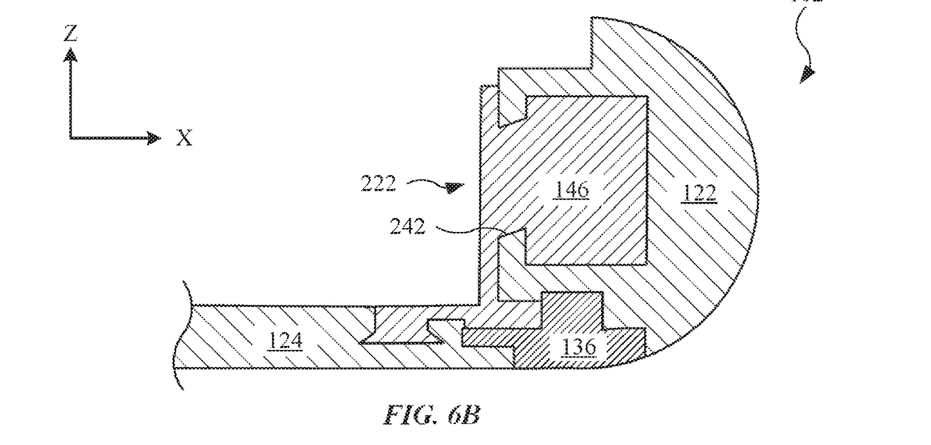
FIG. 6B illustrates a cross sectional view of the enclosure shown in FIG. 5, taken along the B-B line in FIG. 5.

FIG. 6B illustrates a cross sectional view of the enclosure 102 shown in FIG. 5, taken along the B-B line in FIG. 5. As shown, the material 146 can fill the compartment defined in part by the first through hole 222. Also, as shown, the outer perimeter 242 of the first through hole 222 can be formed at some non-zero angle with respect to a horizontal planed defined by the second housing part 124. This can enhance the retention of the first housing part 122 provided by material 146. Accordingly, the material 146 can form an additional interlock with the first housing part 122 with the second housing part 124.

Figure 6C:
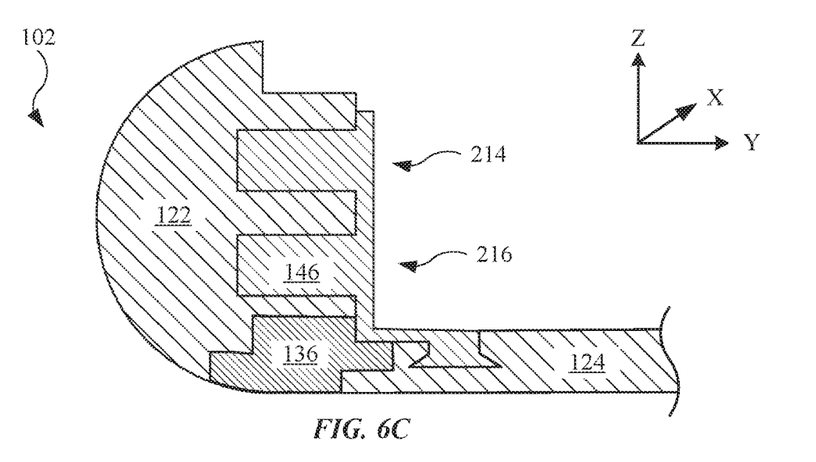
FIG. 6C illustrates a cross sectional view of the enclosure shown in FIG. 5, taken along the C-C line in FIG. 5.

FIG. 6C illustrates a cross sectional view of the enclosure 102 shown in FIG. 5, taken along the C-C line in FIG. 5. As shown, the material 146 can extend into the third indention 214 and the fourth indention 216. As a result, the material 146 can limit or prevent lateral movement of the first housing part 122 with respect tot the second housing part in the x-dimension (perpendicular to the y-z plane).

FIGS. 6A-6C also show the material 136 (on the exterior of the enclosure 102) engaging the material 146 (on the interior of the enclosure 102). In some instances, an electronic device that includes the enclosure 102 also includes an antenna component (not shown) used for wireless communication. In this regard, the material 136 and the material 146 can include a non-metal material that allows radio frequencies to penetrate therethrough. In this regard, when the material 136 and the material 146 are engaged with one another, the material 136 and the material 146 can combine to define a radio frequency "window" and the enclosure 102 can be substantially formed from metal other than a channel that receives the material 136 and the material 146, and an additional channel (not shown).

Figure 7:
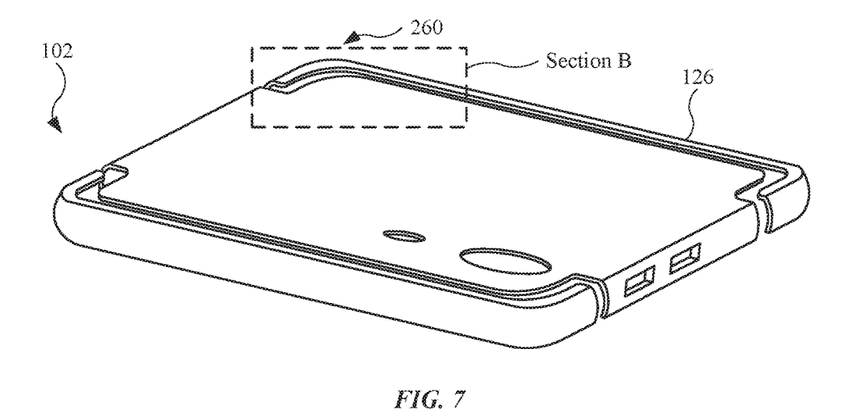
FIG. 7 illustrates a rear isometric view the enclosure, showing the layers of material removed from the enclosure.

FIG. 7 illustrates a rear isometric view the enclosure 102, showing the layers of material removed from the enclosure. As shown, the enclosure 102 can include a second corner portion 260 that is defined by the third housing part 126.

Figure 8:
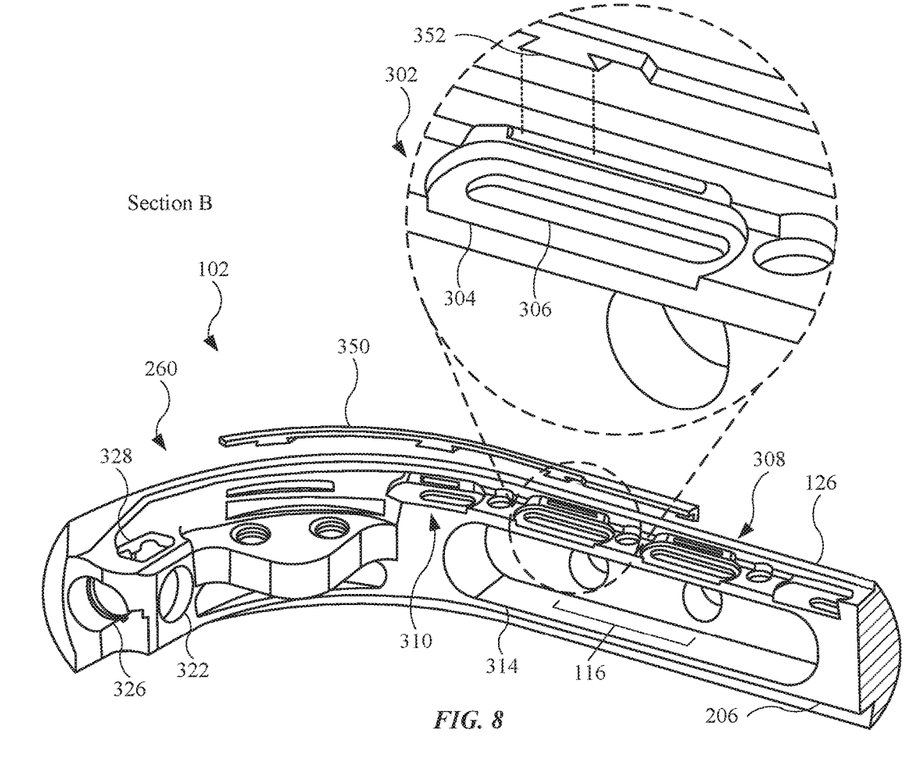
FIG. 8 illustrates an isometric view of the third housing part of the enclosure, taken along Section B at the second corner portion, showing various features of the enclosure that enable interlocking between the second housing part (not shown)

FIG. 8 illustrates an isometric view of the third housing part 126 of the enclosure 102, taken along Section B at the second corner portion 260, showing various features of the enclosure 102 that enable interlocking between the second housing part (not shown). Similar to the first housing part 122 (shown in FIG. 4), the third housing part 126 can include various geometric configurations designed to receive a molded material to form interlocks with the third housing part 126. For example, the third housing part 126 can include multiple indentions having a stepped, or "staircase," profile that provides a tiered system of interlocks when a molded material (not shown) is imposed in the stepped profile. As shown in the enlarged view, the third housing part 126 can include a first stepped indention 302 formed by a cutting operation previously described. The first stepped indention 302 can include a first indented portion 304 and second indented portion 306. As shown, the second indented portion 306 can open to the first indented portion 304, and also, can open to the first indented portion 304. This allows the first stepped indention 302 to receive a molded material to form an interlock. The third housing part 126 can include additional stepped indentions, such as a second stepped indention 308 and a third stepped indention 310, having a geometry substantially similar to that of the first stepped indention 302. Other stepped indention can include different geometries.

The third housing part 126 can also include openings 116 (also shown in FIG. 16) used by the electronic device 100 (shown in FIG. 1) to emit acoustical energy. As shown in FIG. 8, the openings 116 can open to a bore 314, defined by a larger opening that opens to the internal cavity of the enclosure 102. As shown, the bore 314 can be positioned between the first stepped indention 302 and the platform 206. Accordingly, the second indented portion 306 should be formed so as to not create a region of the third housing part 126 thin enough to deform during formation of the third housing part 126.

Similar the first housing part 122 (shown in FIG. 2), the third housing part 126 can include a first through hole 322 and a second through hole 326 that opens to the first through hole 322. These through holes in the third housing part 126 can combine to define a compartment to receive a molded material to interlock with the third housing part 126. Additionally, the third housing part 126 can include a third through hole 328 that opens to both the first through hole 322 and the second through hole 326, and a molded material can be formed in the compartment to provide an interlock for the third housing part 126 in multiple dimensions.

FIG. 8 further shows an internal component 350. In some embodiments, the internal component 350 is an antenna element designed to transmit or receive radio frequency communication. In some embodiment, internal component 350 can take the form of a parasitic antenna resonating element. The internal component 350 can be carried by the second housing part 124. However, the third housing part 126 can include design modification to ensure that the third housing part 126 does not contact the internal component 350. For example, as shown in the enlarged view, the third housing part 126 can include a first slot 332 in a location corresponding to a first extension 352 of the internal component 350. The first slot 332 can be formed by a material removal operation to provide clearance between the first extension 352 and the third housing part 126. As shown in FIG. 8, the third housing part 126 can include additional slots, with each slot in a location corresponding to an extension of the internal component 350. The relationships between the extensions of the internal component 350 and the slots of the third housing part 126 will be shown below.

Figure 9:
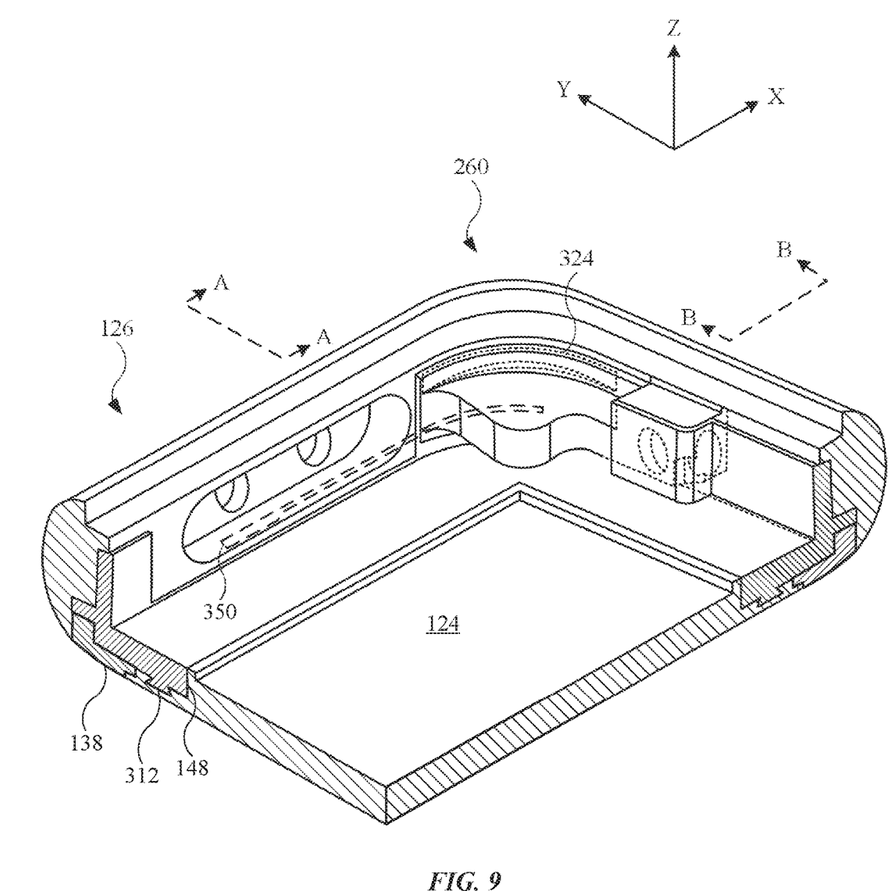
FIG. 9 illustrates an isometric view of the corner portion of the enclosure shown in FIG. 8, further showing the enclosure filled with the internal and external layers.

FIG. 9 illustrates an isometric view of the second corner portion 260 of the enclosure 102 shown in FIG. 8, further showing the enclosure 102 filled with the internal and external layers. As shown, based on their relative positions, the material 138 can be referred to as the "external material"

and the material 148 can be referred to as the "internal material." Also, when the electronic device 100 (shown in FIG. 1) is assembled, the material 138 can cover, or hide, the material 148.

The material 148 (and in some cases, the material 138) can be disposed in the compartment defined by the first through hole 322, the second through hole 326, and the third thorough hole 328 (not shown). As such, the material 148 can interlock with the third housing part 126 to prevent a force that would otherwise decouple or disturb the third housing part 126 with respect to the second housing part 124. Also, the second housing part 124 having a dovetail indention 312 designed to receive the material 148 during a molding operation. In this regard, the third housing part 126 can be secured with the second housing part 124 by the material 148 applied to the aforementioned through holes. Also, the second corner portion 260 can include an indention 324 that receives the material 148 to provide an additional securing between the third housing part 126 and the second housing part 124. Also, the internal component 350 (shown as a dotted line) can be at least partially embedded between the material 148 and the material 138. This will be shown below.

Figure 10A:
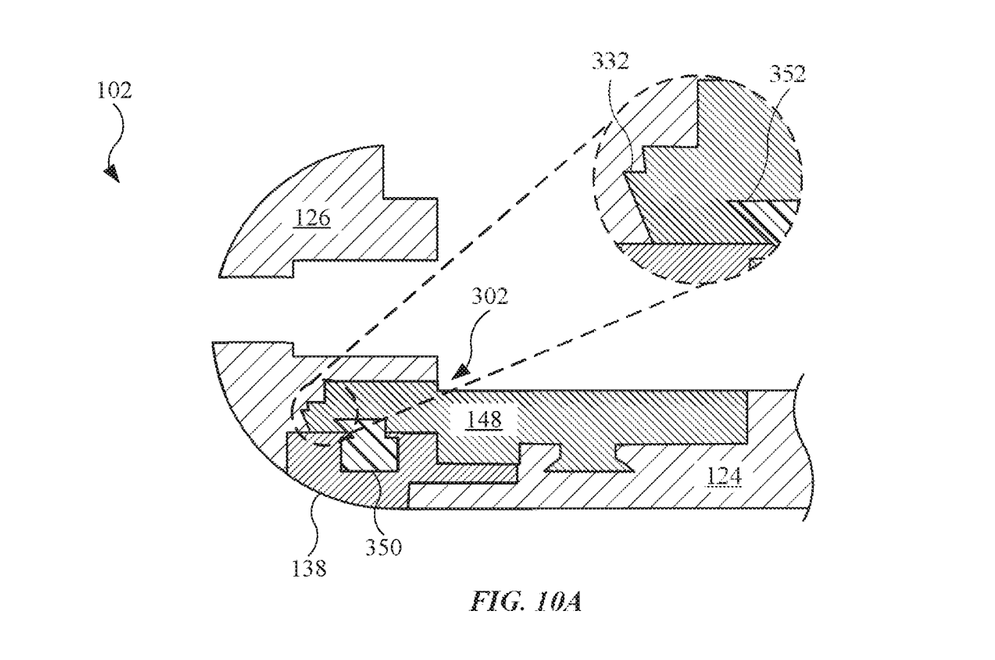
FIG. 10A illustrates a cross sectional view of the enclosure shown in FIG. 9, taken along the A-A line in FIG. 9.

FIG. 10A illustrates a cross sectional view of the enclosure 102 shown in FIG. 9, taken along the A-A line in FIG. 9. As shown in the enlarged view, the internal component 350 can be embedded between the material 138 and the material 148. Further, the internal component 350 can be embedded such that the first extension 352 is aligned with the first slot 332 of the first stepped indention 302. In this manner, the third housing part 126 is sufficient spaced apart from the internal component 350 so as to not contact the internal component 350, even in the event of force applied to the third housing part 126 that causes the third housing part 126 to move relative to the internal component 350. This can be desirable, particularly when the internal component 350 is an antenna element that should remain free of contact with metals, such as the third housing part 126. Also, when the internal component 350 is an antenna element, the internal component 350 is positioned in the enclosure 102 to transmit or receive RF communication.

Figure 10B:
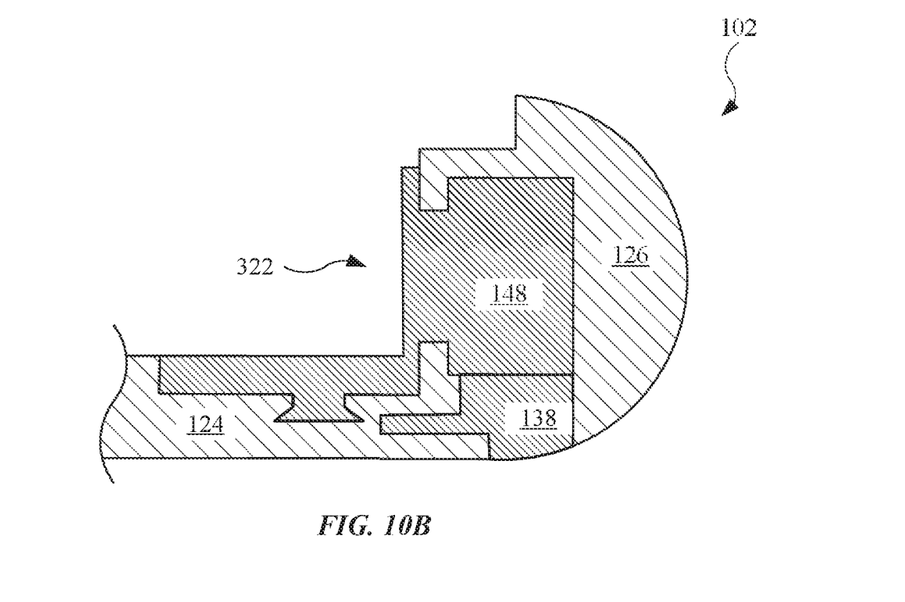
FIG. 10B illustrates a cross sectional view of the enclosure shown in FIG. 9, taken along the B-B line in FIG. 9.

FIG. 10B illustrates a cross sectional view of the enclosure shown in FIG. 9, taken along the B-B line in FIG. 9. As shown, the material 148 can fill the first through hole 322 to interlock with the third housing part 126. Further, when the material 148 is disposed in the second housing part 124, as shown in FIG. 10B, the third housing part 126 is interlocked with the second housing part 124. Also, when the material 138 and the material 148 are engaged with one another, the material 138 and the material 148 can combine to define a radio frequency "window" and the enclosure 102 can be substantially formed from metal other than a channel that receives the material 138 and the material 148, and an additional channel (not shown).

Figure 11:
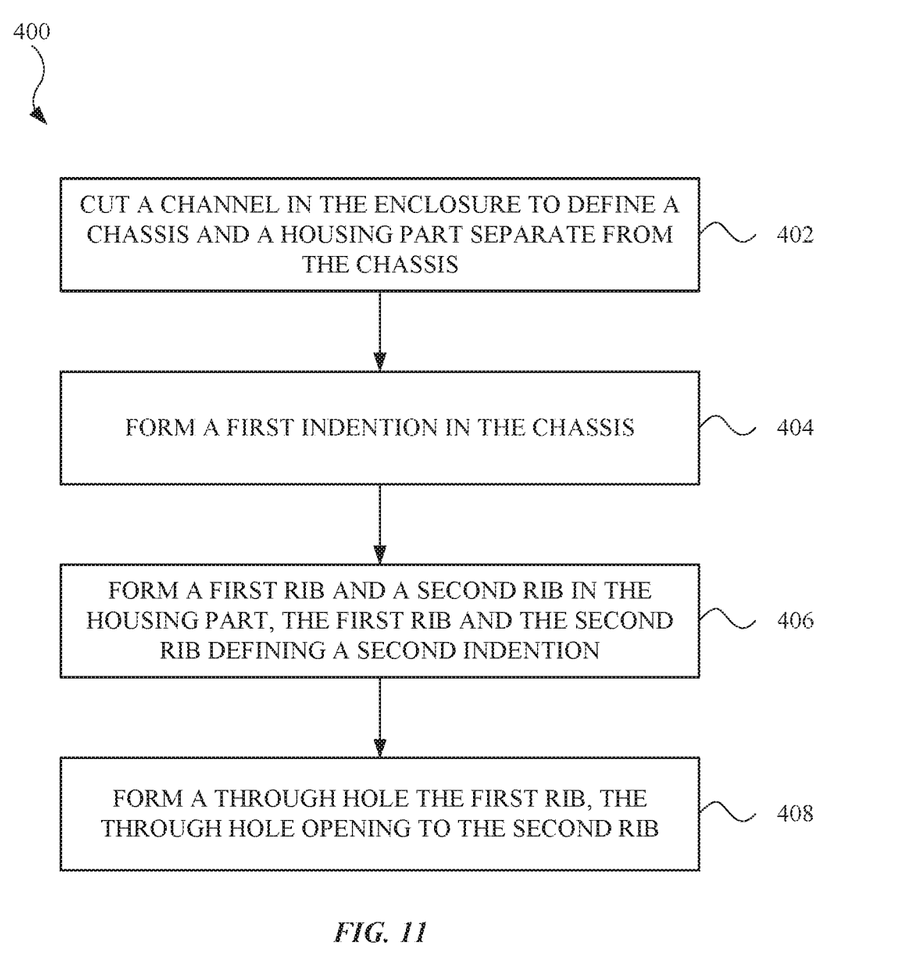
FIG. 11 illustrates a flowchart 400 showing a method for making an enclosure for an electronic device, in accordance with some described embodiments.

FIG. 11 illustrates a flowchart 400 showing a method for making an enclosure for an electronic device, in accordance with some described embodiments. The enclosure can be adapted to receive a molding material. In step 402, a channel is cut in the enclosure to define a chassis and a housing part separate from the chassis. The cutting operation can include CNC cutting. Also, the chassis and the housing part can both be formed from the same metal.

In step 404, a first indention in the chassis is formed. The indention can be used to receive a molding material, which can include a resin material that interlocks with the chassis. In step 406, a first rib and a second rib are formed the housing part. The first rib and the second rib can define a second indention. In step 408, a through hole is formed in the first rib. The through hole can open to the second rib. Also, the first indention, the second indention, and the through hole can the molding material to retain the housing part with the chassis.

A method of joining a metal portion of a housing of a consumer electronic device that includes an RF antenna portion and a non-metal portion is described. The method includes at least the following operations: machining a micro-feature in metal portion, the micro-feature characterized as having a cavity, the cavity located within a region defined by an interior surface of the RF antenna portion, causing an amount of a dual state material in a liquid state to flow into the cavity, the dual state material being capable of transitioning between the liquid state and a solid state, and causing the amount of the dual state material in the liquid state within the cavity to transition from the liquid state to the solid state, wherein the dual state material in the solid state within the cavity locks the RF antenna portion and the non-metal portion together such that metal other than that associated with the RF antenna is excluded from the region. In one embodiment, the micro-feature comprises a through hole having a wall that defines the cavity, the cavity characterized as being aligned with a longitudinal axis. In one embodiment, an amount of the dual state material in the solid state within the cavity defines a retaining mechanism that resists a force component applied to the locked portion, the force component being aligned with the longitudinal axis. In one embodiment, an interior surface of the wall is textured. In one embodiment, the metal is aluminum.

A consumer electronic product includes a housing assembly having walls that define an internal volume, wherein at least one wall is a radio frequency (RF) antenna that comprises a metal portion that defines a region that extends a distance d into the internal volume, the metal portion having a micro-feature, the micro-feature located within a region that extends from an interior surface of the wall into the internal volume to the distance d, a non-metal portion formed of a dual state material, the dual state material capable of transitioning between a liquid state and a solid state, and a small scale interlock that locks the metal portion and the non-metal portion together, the small scale interlock comprising an amount of the dual state material in the solid state engaged with the micro-feature. In one embodiment, the micro-feature includes a first through hole having a first wall that defines a first internal cavity and characterized as having a first longitudinal axis, the first longitudinal axis being aligned with a first directional component. In one embodiment, the micro-feature comprising a second through hole having a second wall that defines a second interior cavity and characterized as having a second longitudinal axis, the second longitudinal axis being aligned with combination of a second directional component and a third directional component. In one embodiment, the first, second, and third directional components are mutually orthogonal to each other. In one embodiment, the first wall of the first through hole comprises a first textured surface. In one embodiment, the second wall of the second through hole comprises a second textured surface. In one embodiment, the dual state material is plastic that engages the micro-feature in the liquid state during an injection molding operation. In one embodiment, an amount of the dual state material in the solid state that is engaged with the first through hole provides a retention force against a first directional component of a force applied to the housing assembly. In one embodiment, the micro-feature includes a tiered layer interlock. In one embodiment, the tiered interlock includes a first tier layer and a second tier layer, the first tier layer being smaller than the second tier layer. In one embodiment, metal other than that associated with the RF antenna is excluded from the region/

An interlock used to join a first part formed of a metal material and a second part formed of a non-metal material that is capable of transitioning between a liquid state and a solid state includes a micro-feature formed in the first part that includes a first through hole having a first wall that defines a first internal cavity and characterized as having a first longitudinal axis, the first longitudinal axis being aligned with a first directional component, and a second through hole having a second wall that defines a second interior cavity and characterized as having a second longitudinal axis, the second longitudinal axis being aligned with combination of a second directional component and a third directional component, and an amount of the non-metal material in the solid state located within the first and second cavities that locks together the first and second parts. In one embodiment, the first part formed of metal includes an RF antenna. In one embodiment, the amount of the non-metal material is located within the first and second cavities by way of an injection molding operation.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data that can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A housing for a consumer electronic product, comprising: a first metal housing part having side walls that (i) include micro-features formed thereon, and (ii) define an internal volume, wherein the first metal housing part is coupled to a radio frequency (RF) antenna configured to emit a RF signal;
a second metal housing part having a bottom wall, the bottom wall including an edge having an indention that together with at least one of the side walls defines a channel, wherein the first and second metal housing parts are separated by the channel; and
a dielectric element that fills the channel and the micro-features to interlock and electrically isolate the first and second metal housing parts, the dielectric element including a first dielectric element and a second dielectric element, wherein the first dielectric element mechanically interlocks with the first and second metal housing parts, and the second dielectric element partially fills the channel and defines an exterior surface of the housing.

2. The housing for the consumer electronic product as recited in claim 1, wherein at least one of the micro-features includes a first through hole characterized as having a first longitudinal axis.

3. The housing for the consumer electronic product as recited in claim 2, wherein at least one of the micro-features include a second through hole characterized as having a second longitudinal axis, and the second through hole is oriented at a non-zero angle relative to the first through hole.

4. The housing for the consumer electronic product as recited in claim 3, wherein the side walls include upper edges that define a platform capable of receiving a transparent protective cover that defines and overlays the internal volume.

5. The housing for the consumer electronic product as recited in claim 1, wherein the first dielectric element and the second dielectric element combine to fill the channel.

6. The housing for the consumer electronic product as recited in claim 1, wherein the first dielectric element includes an internal surface that defines the internal volume.

7. The housing for the consumer electronic product as recited in 1, wherein the dielectric element includes an amount of a dual state material in a solid state.

8. The housing for the consumer electronic product as recited in claim 1, wherein the micro-features have a tiered layer interlock.

9. The housing for the consumer electronic product as recited in claim 8, wherein the tiered layer interlock comprises a first tier layer and a second tier layer, the first tier layer being smaller than the second tier layer.

10. A method for making an enclosure for an electronic device, the method comprising:
forming micro-features in side walls of a first metal housing part, wherein the side walls define an internal volume, and the first metal housing part is coupled to a radio frequency (RF) antenna configured to emit a RF signal; forming a bottom wall in a second metal housing part, wherein the bottom wall includes an edge having an indention;
coupling the first metal housing part to the second metal housing part, wherein the indention and at least one of the side walls define a channel, and the first and second metal housing parts are separated by the channel; and
filling the channel and the micro-features with a dielectric element such as to interlock and electrically isolate the first and second metal housing parts, the dielectric element including a first dielectric element and a second dielectric element, wherein the first dielectric element mechanically interlocks with the first and second metal housing parts, and the second dielectric element partially fills the channel and defines an exterior surface of the housing.

11. The method of claim 10, wherein the side walls include a first wall having a first through hole and a second wall having a second though hole.

12. The method of claim 11, wherein the first through hole is oriented at a non-zero angle relative to the second through hole.

13. The method of claim 10, wherein the side walls include edges that define a platform capable of receiving a protective cover that defines and overlays the internal volume.

14. The method of claim 10, wherein the dielectric element includes a dual state material.

15. The method of claim 10, wherein the first dielectric element and the second dielectric element combine to fill the channel.

16. A housing for a portable electronic device, the housing comprising:
   a corner housing part having side walls that (i) include micro-features, and (ii) define an internal volume, wherein the corner housing part is coupled to a radio frequency (RF) antenna configured to radiate a RF signal;
   a bottom housing part having a bottom wall, the bottom wall including an edge having an indention that together with at least one of the side walls defines a channel, wherein the corner and bottom housing parts are separated by the channel; and
   a dielectric element that fills the channel and the micro-features to interlock and electrically isolate the corner and bottom housing parts, the dielectric element including a first dielectric element and a second dielectric element, wherein the first dielectric element mechanically interlocks with the corner and bottom housing parts, and the second dielectric element partially fills the channel and defines an exterior surface of the housing.

17. The housing as recited in claim 16, wherein the corner housing part comprises the RF antenna.

18. The housing as recited in claim 16, wherein the micro-features are oriented at a non-zero angle relative to the bottom wall.

19. The housing as recited in claim 16, wherein the first dielectric element and the second dielectric element combine to fill the channel.

20. The housing as recited in claim 16, wherein the first dielectric element includes an internal surface that partially defines the internal volume.

* * * * *